(12) United States Patent
Bae et al.

(10) Patent No.: US 11,836,003 B2
(45) Date of Patent: *Dec. 5, 2023

(54) FOLDABLE DISPLAY DEVICE INCLUDING A FIRST AND SECOND DIGITIZER AND DRIVING METHOD THEREOF

(71) Applicant: SAMSUNG DISPLAY CO., LTD., Yongin-si (KR)

(72) Inventors: Jong Man Bae, Yongin-si (KR); Jong Hwa Kim, Yongin-si (KR); Se Hun Park, Yongin-si (KR); Chang Mo Park, Yongin-si (KR); So Yeon Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/694,409

(22) Filed: Mar. 14, 2022

(65) Prior Publication Data

US 2022/0197442 A1 Jun. 23, 2022

Related U.S. Application Data

(63) Continuation of application No. 16/935,041, filed on Jul. 21, 2020, now Pat. No. 11,275,404.

(30) Foreign Application Priority Data

Dec. 10, 2019 (KR) .......................... 10-2019-0164114

(51) Int. Cl.
*G06F 1/16* (2006.01)
*G06F 3/041* (2006.01)
(Continued)

(52) U.S. Cl.
CPC .......... *G06F 1/1616* (2013.01); *G06F 1/1626* (2013.01); *G06F 1/1643* (2013.01);
(Continued)

(58) Field of Classification Search
CPC .... G06F 1/1616; G06F 1/1626; G06F 1/1643; G06F 1/1652; G06F 1/1656;
(Continued)

(56) References Cited

U.S. PATENT DOCUMENTS 9,804,635 B2 10/2017 Kim et al.
10,489,000 B2 11/2019 Chae et al.
(Continued)

FOREIGN PATENT DOCUMENTS

KR 10-1643377 B1 7/2016
KR 10-2018-0130151 A 12/2018

*Primary Examiner* — Chun-Nan Lin
(74) *Attorney, Agent, or Firm* — Lewis Roca Rothgerber Christie LLP

(57) ABSTRACT

A foldable display device and a method of driving the foldable display device are provided. The foldable display device may include a first region, a second region, and a third region configured to bend along a folding axis between the first region and the second region. The foldable display device may include a display panel having a plurality of pixels; a touch sensor overlapping the third region and on an upper surface of the display panel; a first digitizer provided under the display panel to overlap the first region; and a second digitizer provided under the display panel to overlap the second region.

19 Claims, 14 Drawing Sheets

(51) Int. Cl.
*G06F 3/044* (2006.01)
*H10K 59/40* (2023.01)
*H10K 77/10* (2023.01)
*H10K 102/00* (2023.01)

(52) U.S. Cl.
CPC .......... *G06F 1/1656* (2013.01); *G06F 3/0446* (2019.05); *G06F 3/04162* (2019.05); *H10K 59/40* (2023.02); *H10K 77/111* (2023.02); G06F 2203/04102 (2013.01); G06F 2203/04107 (2013.01); G06F 2203/04112 (2013.01); H10K 2102/311 (2023.02)

(58) Field of Classification Search
CPC . G06F 2203/04102; G06F 2203/04106; G06F 2203/04107; G06F 2203/04112; G06F 3/04162; G06F 3/0418; G06F 3/04186; G06F 3/0446; G06F 3/046; H01L 2251/5338; H01L 27/323; H01L 51/0097
See application file for complete search history.

(56) References Cited

U.S. PATENT DOCUMENTS

| | | | |
|---|---|---|---|
| 10,495,941 B2 | 12/2019 | Hashimoto et al. | |
| 10,592,051 B1 | 3/2020 | Yildiz et al. | |
| 10,595,783 B2 | 3/2020 | Park et al. | |
| 10,747,264 B1 | 8/2020 | Knoppert et al. | |
| 10,782,817 B2 | 9/2020 | Kang et al. | |
| 10,852,769 B2 | 12/2020 | Yildiz et al. | |
| 10,928,855 B2 | 2/2021 | Knoppert | |
| 10,976,873 B2 | 4/2021 | Shin et al. | |
| 11,132,020 B2 | 9/2021 | Kim et al. | |
| 2011/0210937 A1 | 9/2011 | Kee et al. | |
| 2015/0338888 A1 | 11/2015 | Kim et al. | |
| 2015/0378557 A1 | 12/2015 | Jeong et al. | |
| 2016/0062516 A1* | 3/2016 | Jeong ............ G06F 1/1643 345/174 |
| 2018/0081219 A1* | 3/2018 | Kim ............... G06F 1/1652 |
| 2018/0088690 A1* | 3/2018 | Seo ............... H01F 1/0302 |
| 2018/0102496 A1 | 4/2018 | Kim et al. | |
| 2018/0246595 A1 | 8/2018 | Chae et al. | |
| 2018/0335679 A1 | 11/2018 | Hashimoto et al. | |
| 2018/0341290 A1 | 11/2018 | Sim et al. | |
| 2019/0163003 A1* | 5/2019 | Kim ............... G06F 1/1643 |
| 2019/0250671 A1 | 8/2019 | Park et al. | |
| 2020/0159293 A1 | 5/2020 | Seibert et al. | |
| 2020/0209998 A1 | 7/2020 | Shin et al. | |
| 2020/0333836 A1 | 10/2020 | Kim et al. | |
| 2020/0364021 A1 | 11/2020 | Park et al. | |
| 2021/0105894 A1 | 4/2021 | Oh et al. | |
| 2021/0165452 A1 | 6/2021 | Knoppert | |
| 2021/0208709 A1 | 7/2021 | Shin et al. | |

* cited by examiner

FIG. 1
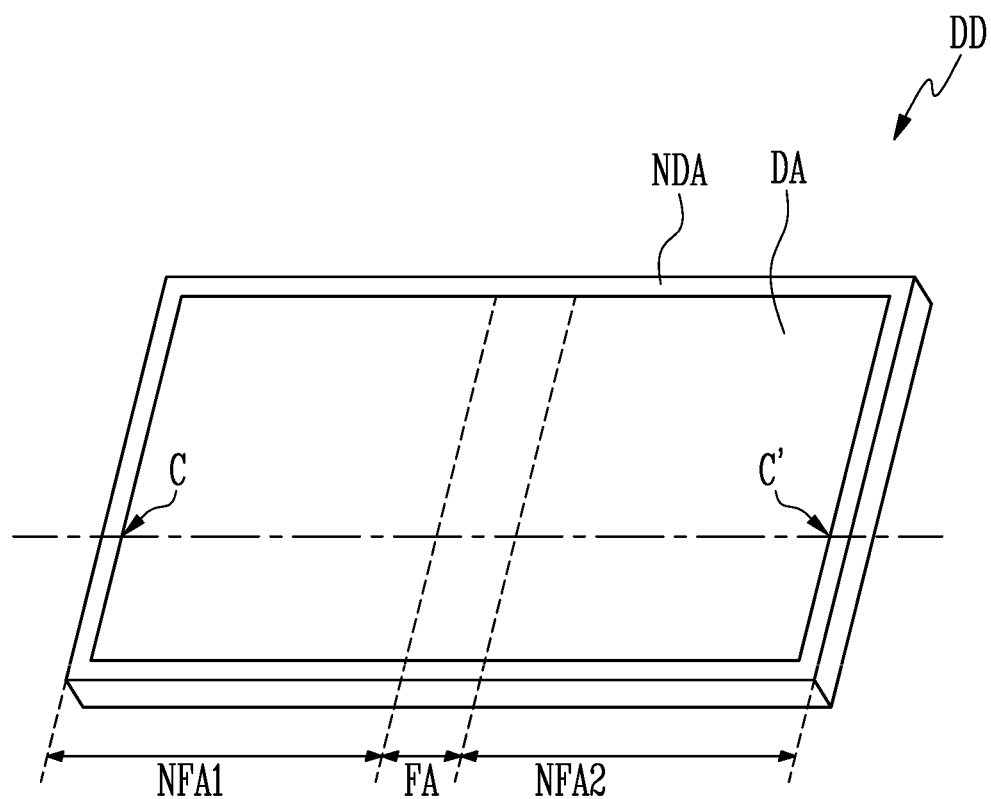
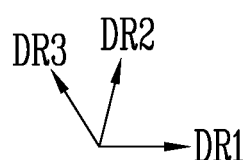

FIG. 13
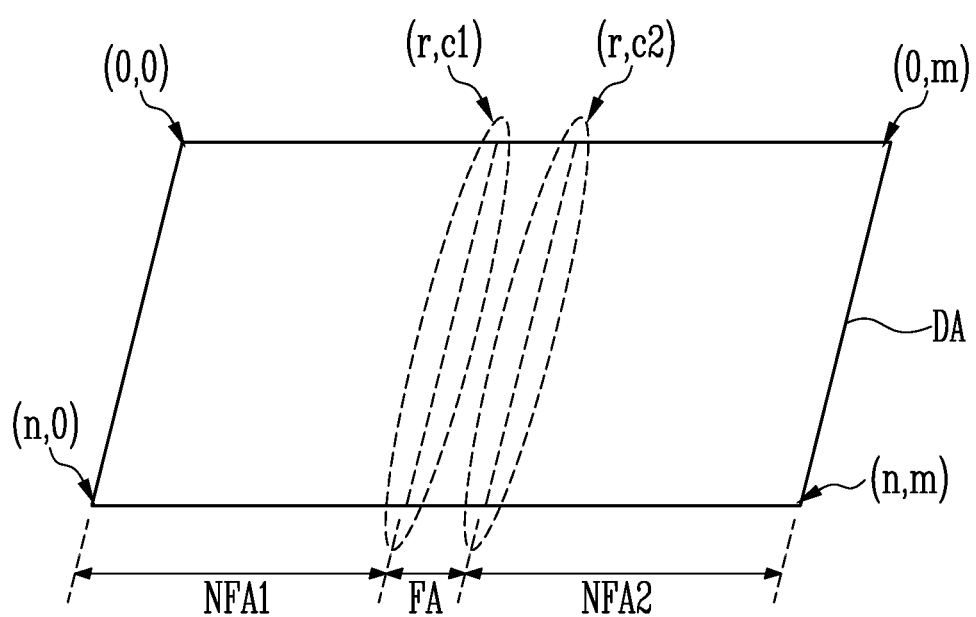
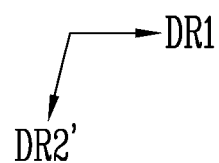

FOLDABLE DISPLAY DEVICE INCLUDING A FIRST AND SECOND DIGITIZER AND DRIVING METHOD THEREOF

CROSS-REFERENCE TO RELATED APPLICATIONS

This application is a continuation of U.S. patent application Ser. No. 16/935,041, filed Jul. 21, 2020, which claims priority to and the benefit of Korean Patent Application No. 10-2019-0164114, filed Dec. 10, 2019, the entire content of both of which is incorporated herein by reference.

BACKGROUND

1. Field

Embodiments of the present disclosure relate to a foldable display device, and more particularly, to a foldable display device and a method of driving the foldable display device.

2. Description of Related Art

With the development of information technology, the importance of a display device that provides a connection medium between a user and information has been emphasized. Owing to the importance of the display device, the use of various types or kinds of display devices such as a liquid crystal display device, an organic light-emitting display device, and a plasma display device has increased.

Recently, research on a foldable display device, a bendable display device, a rollable display device, etc. utilizing advantages of a flexible display panel which is bendable and/or foldable has been conducted. Such display devices may be applied to various suitable fields, e.g., not only to a portable electronic device and a wearable device, but also to a television, a monitor, etc.

Foldable display devices may be classified into an in-folding type or kind, in which the display device is folded such that display surfaces thereof face each other, and an out-folding type or kind, in which the display device is folded such that display surfaces thereof are oriented outwards (e.g., are oriented to face away from each other).

The display devices include a touch sensor as well as a keyboard and/or a mouse, as an input device. When a user presses or touches a display screen of the display device with a finger or a pen, the touch sensor detects a signal generation position (e.g., a position signal) due to the occurrence of the touch or a change in electrical capacity, and then transmits the signal generation position (e.g., the position signal) to various suitable controllers.

SUMMARY

Aspects of some embodiments of the present disclosure are directed to a foldable display device having both a touch sensor and a digitizer.

Furthermore, aspects of some embodiments of the present disclosure are directed to a method of driving a foldable display device that ensures uniform touch performance by matching touch data of a touch sensor and a digitizer with each other.

However, aspects and features of the present disclosure are not limited to the above-described aspects and features, and various suitable modifications are possible without departing from the spirit and scope of the present disclosure.

A foldable display device according to an embodiment of the present disclosure may achieve the above aspects and features.

An embodiment of the present disclosure may provide a foldable display device, including a display panel including a first region, a second region, a third region configured to bend along a folding axis between the first region and the second region, and pixels in the first region, the second region, and the third region; a touch sensor overlapping the third region, and on an upper surface of the display panel; a first digitizer under the display panel to overlap the first region; and a second digitizer under the display panel to overlap the second region.

The foldable display device may further include a shock absorber coupled to a lower surface of the display panel via an adhesive layer to protect the display panel.

The shock absorber may be between at least one selected from among the first and second digitizers and the display panel.

The foldable display device may further include a first shield electrode on a lower surface of the first digitizer to shield electromagnetic noise; and a second shield electrode on a lower surface of the second digitizer to shield the electromagnetic noise.

The first digitizer and the second digitizer may be spaced apart from each other so as to not overlap the third region.

The touch sensor may overlap the first region and the second region.

The foldable display device may further include a touch controller configured to receive touch data from the touch sensor, the first digitizer, and the second digitizer, and to correct and output the received touch data.

The foldable display device may further include a memory configured to store a matching table in which a match relationship between first touch data received from the touch sensor and second touch data received from the first digitizer or the second digitizer is set.

The touch controller may include a touch data selector configured to select either the first touch data or the second touch data according to a set reference; and a touch data corrector configured to correct the first touch data transmitted from the touch data selector, with reference to the matching table.

The touch data selector may transmit the first touch data to the touch data corrector, if both the first touch data and the second touch data are received and a position coordinate of the first touch data corresponds to the third region.

The touch data selector may select the second touch data, if both the first touch data and the second touch data are received and the position coordinate of the first touch data corresponds to the first region or the second region.

The touch data selector may transmit the first touch data to the touch data corrector, if the second touch data is not received and the first touch data is received.

The touch data corrector may correct a pen pressure level of the first touch data at a pen pressure level of the second touch data matched with a pen pressure level of the first touch data, with reference to the matching table.

The touch data corrector may correct a position coordinate of the first touch data by a position coordinate difference between the first touch data and the second touch data, with reference to the matching table.

A method of driving a foldable display device according to an embodiment of the present disclosure may achieve the above aspects and features.

Another embodiment of the present disclosure may provide a method of driving a foldable display device, the display device including a first region, a second region, and a third region configured to bend along a folding axis between the first region and the second region, the method including acquiring at least one selected from among first touch data and second touch data; and outputting one of corrected first touch data and the second touch data, according to a set reference.

The first touch data may be data collected from a touch sensor on an upper surface of a display panel of the display device.

The second touch data may be data collected from at least one selected from among a first digitizer under the display panel to overlap the first region and a second digitizer under the display panel to overlap the second region.

The outputting may output the second touch data if both the first touch data and the second touch data are received and a position coordinate of the first touch data corresponds to the first region or the second region.

The outputting may include correcting the first touch data, if the position coordinate of the first touch data corresponds to the third region.

The correcting the first touch data may correct a pen pressure level of the first touch data at a pen pressure level of the second touch data matched with the pen pressure level of the first touch data, with reference to a matching table.

The correcting the first touch data may correct the position coordinate of the first touch data by a position coordinate difference between the first touch data and the second touch data, with reference to a matching table.

The outputting may output the corrected first touch data if the first touch data is acquired and the second touch data is not acquired.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

FIG. 1 is a perspective view of a foldable display device in a non-folded state in accordance with an embodiment of the present disclosure.

FIG. 13 is a diagram illustrating an operation of a touch data selector shown in FIG. 7.

DETAILED DESCRIPTION

Figure 2:
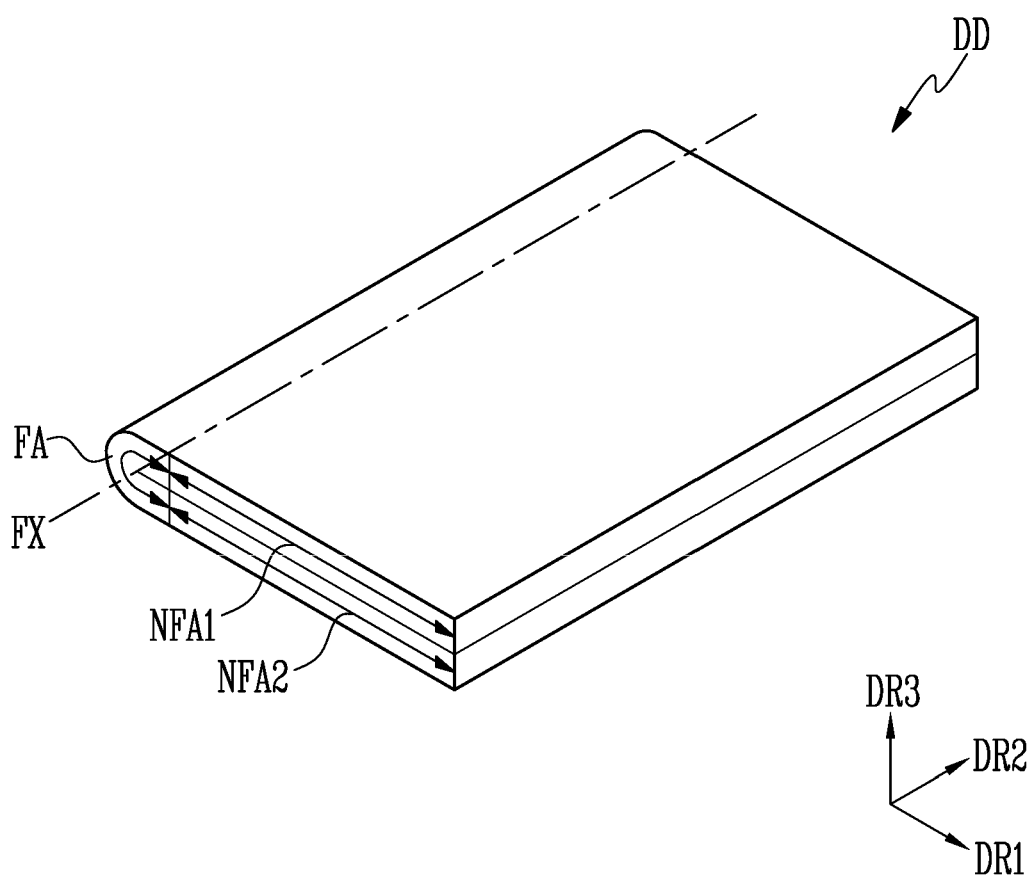
FIG. 2 is a perspective view of the foldable display device in an in-folded state in accordance with the embodiment of the present disclosure.

Hereinafter, embodiments of the present disclosure will be described in more detail with reference to the attached drawings, such that those skilled in the art can implement the present disclosure. The present disclosure may be implemented in various suitable forms, and is not limited to the embodiments described herein below.

In the drawings, portions which are not related to the present disclosure may be omitted to explain the present disclosure more clearly. Reference should be made to the drawings, in which similar reference numerals are used throughout the drawings to designate similar components. Therefore, the aforementioned reference numerals may be used in one or more drawings.

As used herein, the use of the term "may," when describing embodiments of the present disclosure, refers to "one or more embodiments of the present disclosure." As used herein, the term "and/or" includes any and all combinations of one or more of the associated listed items.

In the drawings, the size of each component and the thicknesses of lines illustrating the component may be exaggerated for the sake of ease of explanation, and the present disclosure is not limited thereto. In the drawings, the thicknesses of the components may be exaggerated to clearly illustrate several layers and areas.

FIG. 1 is a perspective view of a foldable display device in a non-folded state according to an embodiment of the present disclosure. FIG. 2 is a perspective view of the foldable display device in an in-folded state according to the embodiment of the present disclosure.

Referring to FIGS. 1 and 2, the foldable display device DD may include a display region DA that displays an image according to image data utilizing pixels, in a third direction DR3 perpendicular to a plane defined by a first direction DR1 and a second direction DR2, and a non-display region NDA other than the display region DA. For example, the non-display region NDA may partially or entirely surround the display region DA. Furthermore, the foldable display device DD may include a plurality of regions defined according to an operation type or kind (e.g., an operation type or kind of the regions). The foldable display device DD may include a first region NFA1, a second region NFA2, and a third region FA disposed between the first region NFA1 and the second region NFA2. The third region FA is a region that may be folded (or bent) with respect to a folding axis FX. When the foldable display device DD is in a folded state, the third region FA may be a region that substantially forms a curvature (e.g., is substantially curved). The folding axis FX may be parallel (e.g., substantially parallel) to the second direction DR2, and the third region FA may have a width in the first direction DR1 perpendicular (e.g., substantially perpendicular) to the second direction DR2. Each of the first region NFA1 and the second region NFA2 may be referred to as a non-folding region, and the third region FA may be referred to as a folding region. The width of the third region FA may be relatively smaller than the width of each of the first region NFA1 and the second region NFA2 (e.g., the width of each of the first region NFA1 and the second region NFA2 in the first direction DR1).

Referring to FIG. 2, the foldable display device DD may be in-folded so that the display region DA of the first region NFA1 and the display region DA of the second region NFA2 face each other. Here, the folding axis FX is shown as one axis for convenience, but the folding axis FX may be composed of (e.g., provided as) a plurality of axes parallel (e.g., substantially parallel) to the second direction DR2. The area of the third region FA may not be fixed but may vary depending on the curvature radius of rotation about the folding axis FX.

Hereinafter, a case where the foldable display device DD is in-folded will be described. However, the present disclosure is not necessarily limited thereto, and a case where the device is out-folded is included among the embodiments of the present disclosure.

Figure 3:
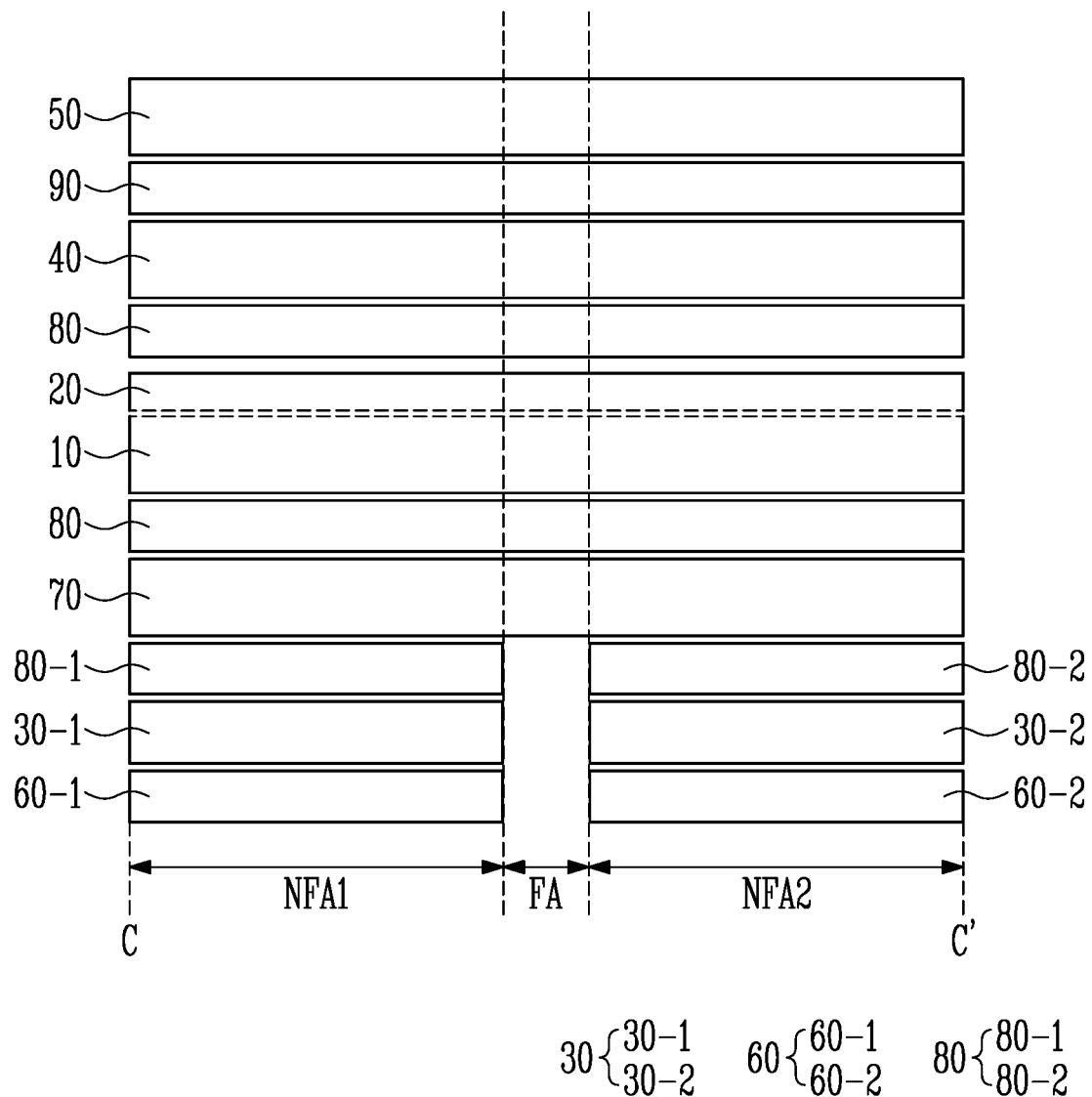
FIG. 3 is a cross sectional view taken along line C-C' of FIG. 1.

FIG. 3 is a cross sectional view taken along line C-C' of FIG. 1.

FIG. 3 is a simplified (or exaggerated) diagram for explaining the stacking relationship of some components included in the foldable display device DD. This should be interpreted to explain the relative arrangement between components, and the thickness and/or area of each component is not to be construed limitedly.

Referring to FIG. 3, the foldable display device DD may include a cover window 50 (e.g., cover glass), an Optically Clear Adhesive (OCA) 90, a polarizer 40, a touch sensor 20, a display panel 10, a shock absorber 70, a digitizer 30, an adhesive layer 80, and a shield electrode 60.

The cover window 50 may be provided on an upper surface (with respect to the third direction DR3 of FIG. 1) of the foldable display device DD. The cover window 50 allows an image of the display panel 10 to pass therethrough as it is (e.g., without modification or substantial modification), and protects the display panel 10 from external shock, scratches, etc. The cover window 50 may include (e.g., be) transparent material having suitable rigidity and/or flexibility. For example, the cover window 50 may include (e.g., be) Ultra Thin Glass (UTG) and/or Colorless polyimide (CPI).

The polarizer 40 may prevent or reduce the reflection of external light so as to improve visibility in a bright place such as the outside. For example, the polarizer 40 may be a film that may pass or block the vertical or horizontal polarization of incident light, and may include (e.g., be) a polyethylene terephthalate (PET) film and/or a tri-acetyl cellulose (TAC) film. The polarizer 40 may be adhered to a lower surface of the cover window 50 by the OCA 90.

The OCA 90 may be a transparent adhesive material that fills an air gap between the polarizer 40 and the cover window 50 to prevent or reduce the loss of light and increase the transmissivity of light. For example, the OCA may be between the polarizer 40 and the cover window 50. Here, the OCA 90 should be interpreted as being an example adhesive material, but may be replaced with another adhesive material (e.g., any suitable adhesive material).

The display panel 10 may be a flexible display panel. For example, the display panel 10 may include a flexible substrate such as a plastic film, and may display an image utilizing a pixel circuit (e.g., a plurality of transistors) disposed on the flexible substrate and a light emitting element such as an organic light emitting diode. The light emitting element and the pixel circuit may be covered with a thin film encapsulation layer. The thin-film encapsulation layer seals the light emitting element from the external environment including water and/or oxygen, thus preventing or reducing deterioration in characteristics. The light emitting element of the present disclosure is not limited to the organic light emitting diode. For example, the light emitting element may be an inorganic light emitting element including (e.g., being) inorganic light emitting material, or a light emitting element (e.g., a quantum dot display element) which emits light while changing the wavelength of light to be emitted utilizing quantum dots.

The touch sensor 20 may overlap the entire display region DA of the foldable display device DD or may overlap the third region FA of the display region DA to sense a user's touch and/or to sense information about the user's fingerprint. The user's touch may include touch coordinates and a touch pressure of a pen PN operated by the user.

The touch sensor 20 may be disposed or directly disposed on an upper surface of the display panel 10. Here, the expression "directly disposed" may mean that no separate adhesive layer or adhesive member is disposed between the display panel 10 and the touch sensor 20. The touch sensor 20 may be formed on a base surface provided by the display panel 10 (or in an on-cell manner) through a continuous process. In more detail, the touch sensor 20 may be formed by patterning sensing electrodes (see FIG. 4) on the thin film encapsulation layer included in the display panel 10.

The display panel 10 on which the touch sensor 20 is disposed may be coupled to the polarizer 40 via an adhesive layer 80. The adhesive layer 80 may include a conductive adhesive member having both adhesive strength and electrical conductivity. For example, the adhesive layer 80 may be a conductive pressure sensitive adhesive (PSA), which is one of conductive adhesive members. In some embodiments, the conductive adhesive member included in (e.g., constituting) the adhesive layer 80 may be any suitable type of conductive adhesive member.

The shock absorber 70 may be coupled to a lower surface of the display panel 10 via an adhesive layer 80. The shock absorber 70 may absorb shock from the outside and protect the display panel 10.

The digitizer 30 (e.g., 30-1 and 30-2) may be coupled to a lower surface of the shock absorber 70 via an adhesive layer 80 (e.g., 80-1 and 80-2), and may sense the coordinate of the pen PN and pen pressure in the display region DA. For example, the digitizer 30 may sense the coordinate of the pen PN and pen pressure in the display region DA through an electro-magnetic resonance (EMR) method. In some embodiments, the adhesive layer 80 that couples the shock absorber 70 to the display panel 10, the adhesive layer 80 that couples the touch sensor 20 to the polarizer 40, and the adhesive layer 80 that couples the digitizer 30 to the shock absorber 70 may be spatially separated adhesive layers.

The shield electrode 60 may be disposed on the lower surface of the digitizer 30. The shield electrode 60 may shield or block unnecessary electromagnetic signals and/or electromagnetic noise, or may assist the digitizer 30 in smoothly performing the electromagnetic resonance with the pen PN.

In some embodiments, the digitizer 30 according to the embodiment of the present disclosure may include a first digitizer 30-1 overlapping the first region NFA1 and a second digitizer 30-2 overlapping the second region NFA2 of FIG. 1. The first digitizer 30-1 and the second digitizer 30-2 may not overlap the third region FA, or may overlap only a portion of the third region FA. Unlike the digitizer 30, the touch sensor 20 may overlap the third region FA, and may also overlap the first region NFA1 and the second region NFA2.

The shield electrode 60 may include a first shield electrode 60-1 coupled to a lower surface of the first digitizer

30-1, and a second shield electrode 60-2 coupled to a lower surface of the second digitizer 30-2.

The adhesive layer 80 that couples the digitizer 30 to the shock absorber 70 may include a first adhesive layer 80-1 and a second adhesive layer 80-2. The first digitizer 30-1 may be coupled to a lower surface of the shock absorber 70 via the first adhesive layer 80-1, while the second digitizer 30-2 may be coupled to the lower surface of the shock absorber 70 via the second adhesive layer 80-2.

It is shown in FIG. 3 that the touch sensor 20 completely overlaps the display panel 10. However, the touch sensor is not limited thereto, and the touch sensor may overlap the display panel 10 in a region corresponding to the third region FA, and may not overlap the display panel 10 in regions corresponding to all or some of the first region NFA1 and the second region NFA2.

Therefore, in order to prevent or reduce the occurrence of problems such as damage to the digitizer 30 or wires breaking by a folding operation, the digitizer 30 may overlap the first region NFA1 and the second region NFA2, for example, non-folding regions that are not affected by the folding operation, and may not overlap all or some of the third region FA. In order to supplement touch recognition in the third region FA, the touch sensor 20 overlapping the third region FA may be provided in the foldable display device DD.

Figure 4:
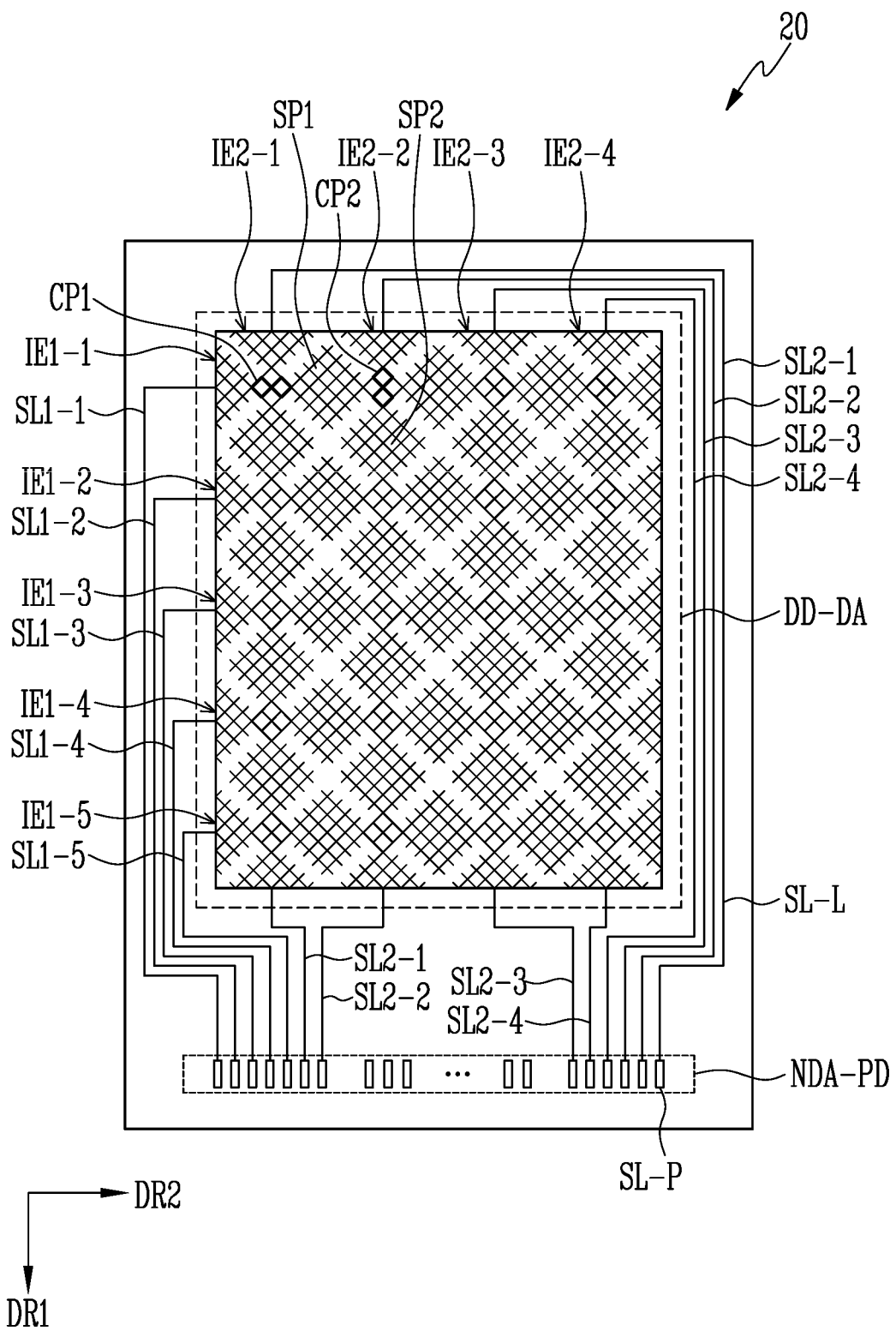
FIG. 4 is a plan view illustrating a touch sensor shown in FIG. 3.

FIG. 4 is a plan view illustrating the touch sensor shown in FIG. 3.

Referring to FIG. 4, the touch sensor 20 may include first sensing electrodes 1E1-1 to 1E1-5, and second sensing electrodes 1E2-1 to 1E2-4. The first sensing electrodes 1E1-1 to 1E1-5 and the second sensing electrodes 1E2-1 to 1E2-4 may overlap all or some (e.g., the third region FA) of the display region DA.

The first sensing electrodes 1E1-1 to 1E1-5 and the second sensing electrodes 1E2-1 to 1E2-4 may have a mesh shape (e.g., pattern). Furthermore, the first sensing electrodes 1E1-1 to 1E1-5 and the second sensing electrodes 1E2-1 to 1E2-4 are disposed not to overlap pixels (or sub pixels of each of the pixels) included in the display panel 10 through the mesh shape, so that the electrodes may not be visually recognized by a user of the display device DD. For examples, in some embodiments, the pixels (or sub pixels of each of the pixels) are positioned to overlap openings in the mesh shape of the first sensing electrodes 1E1-1 to 1E1-5 and the second sensing electrodes 1E2-1 to 1E2-4. Having the mesh shape, each of the first sensing electrodes 1E1-1 to 1E1-5 and the second sensing electrodes 1E2-1 to 1E2-4 may include (e.g., be) silver, aluminum, copper, chrome, nickel, titanium, and/or the like, which may be processed through a low temperature process, but the present disclosure is not limited thereto.

Each of the first sensing electrodes 1E1-1 to 1E1-5 has a shape extending in the second direction DR2. The second sensing electrodes 1E2-1 to 1E2-4 are arranged in the first direction DR1. For example, in some embodiments, each of the second sensing electrodes 1E2-1 to 1E2-4 has a shape extending in the first direction DR1. The second sensing electrodes 1E2-1 to 1E2-4 are alternately arranged with each other in the second direction DR2, and the first sensing electrodes 1E1-1 to 1E1-5 are alternately arranged with each other in the first direction DR1. In some embodiments, the second sensing electrodes 1E2-1 to 1E2-4 cross the first sensing electrodes 1E1-1 to 1E1-5.

Each of the first sensing electrodes 1E1-1 to 1E1-5 may include first sensors SP1 and first connectors CP1. Each of the second sensing electrodes 1E2-1 to 1E2-4 may include second sensors SP2 and second connectors CP2. In each of the first sensing electrodes 1E1-1 to 1E1-5, the first sensors SP1 may be arranged with each other in the second direction DR2. In each of the second sensing electrodes 1E2-1 to 1E2-4, the second sensors SP2 may be arranged with each other in the first direction DR1. Each of the first connectors CP1 couples the adjacent first sensors SP1 to each other. Each of the second connectors CP2 couples the adjacent second sensors SP2 to each other.

The touch sensor 20 may further include first signal lines SL1-1 to SL1-5 electrically coupled to one ends of the first sensing electrodes 1E1-1 to 1E1-5, and second signal lines SL2-1 to SL2-4 electrically coupled to one or both ends of the second sensing electrodes 1E2-1 to 1E2-4. For example, each of the first signal lines SL1-1 to SL1-5 may be electrically coupled to one end of a corresponding one of the first sensing electrodes 1E1-1 to 1E1-5, and each of the second signal lines SL2-1 to SL2-4 may be electrically coupled to one or both ends of a corresponding one of the second sensing electrodes 1E2-1 to 1E2-4.

Each of the first and second signal lines SL1-1 to SL1-5 and SL2-1 to SL2-4 may include a line part SL-L and a pad part SL-P. The pad parts SL-P may be arranged in a pad region NDA-PD. The touch sensor 20 may include signal pads. The signal pads may be arranged in the pad region NDA-PD.

In an embodiment of the present disclosure, the first signal lines SL1-1 to SL1-5 and the second signal lines SL2-1 to SL2-4 may be replaced with a printed circuit board which may be separately manufactured and coupled to other components.

The pitches and widths of the first sensing electrodes 1E1-1 to 1E1-5 and the second sensing electrodes 1E2-1 to 1E2-4 may be changed depending on the use of the touch sensor 20. The sensing electrodes for sensing the user's touch may have a width ranging from several millimeters (mm) to several tens of millimeters (mm). The sensing electrodes for sensing the user's fingerprint may have a width ranging from several tens of micrometers (μm) to several hundreds of micrometers (μm).

According to some embodiments of the present disclosure the driving method of the touch sensor 20 may sense the touch (or fingerprint) pressure in a mutual cap method (e.g., mutual capacitance method) and/or a self cap method (e.g., self-capacitance method), but the driving method of the touch sensor 20 is not limited thereto.

Figure 5:
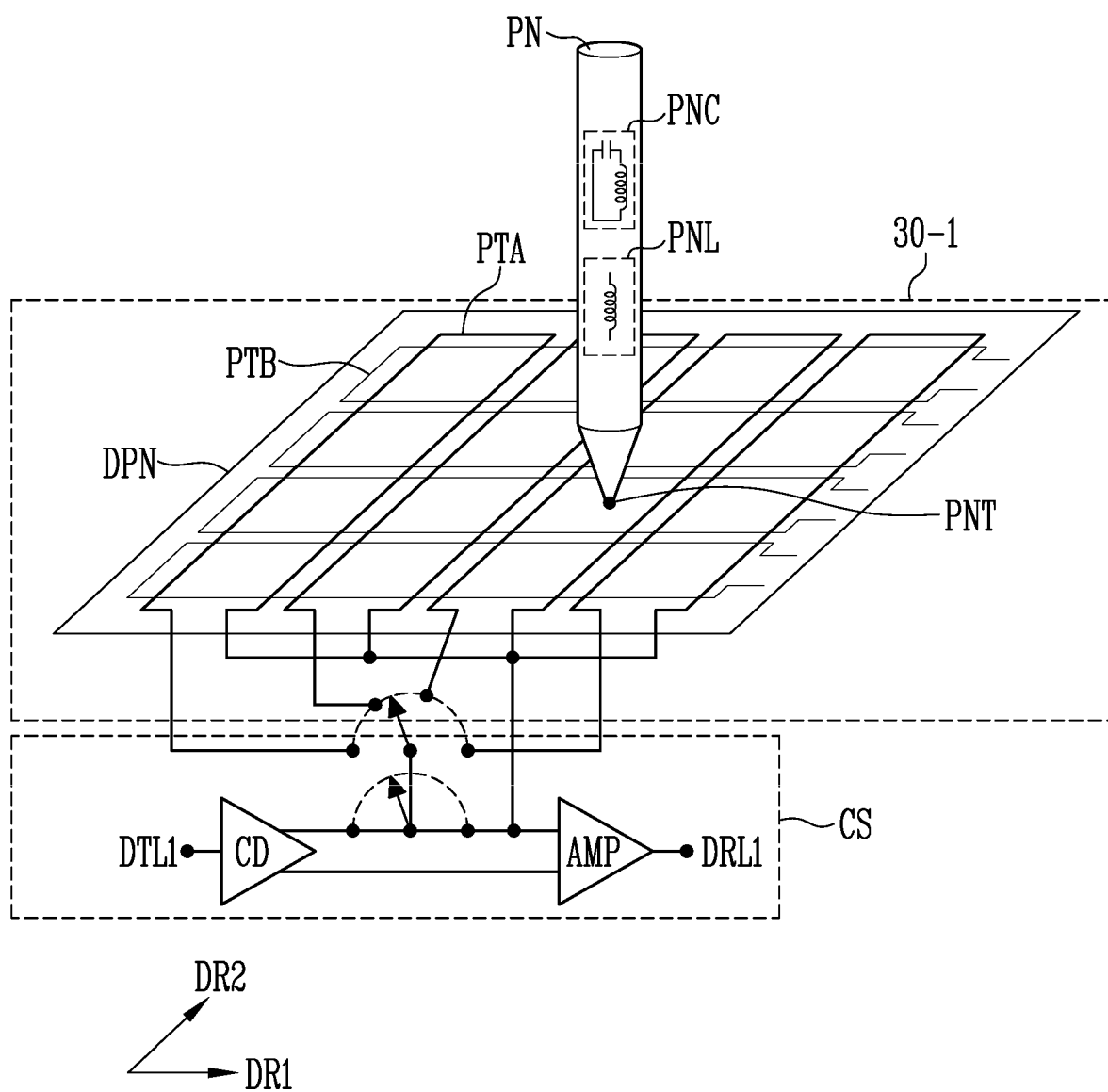
FIG. 5 is a perspective view showing a first digitizer and a connection set coupled to the first digitizer in accordance with the embodiment of the present disclosure.

FIG. 5 is a perspective view showing the first digitizer and a connection set coupled to the first digitizer according to the embodiment of the present disclosure.

Referring to FIG. 5, the first digitizer 30-1 may include conductive patterns PTA and PTB for receiving an input from the pen PN (e.g., for detecting position coordinates and pressure of the pen PN) based on electromagnetic induction. The conductive patterns PTA and PTB may be set or predetermined patterns formed by patterning a conductor (e.g., patterning a conductive layer) on a flexible printed circuit board DPN or by printing on the flexible printed circuit board DPN with conductive ink.

The conductive patterns PTA and PTB may include a first conductive pattern PTA in which a plurality of loop coils are arranged in a row in the first direction DR1, and a second conductive pattern PTB in which a plurality of loop coils are arranged in the second direction DR2 orthogonal (e.g., perpendicular) to the first direction DR1. For example, loop coils of the first conductive pattern PTA may extend in the second direction DR2 and may be arranged with each other along (in) the first direction DR1, and the loop coils of the second conductive pattern PTB may extend in the first direction DR1 and may be arranged with each other along (in) the second direction DR2. However, the patterns of the conductive patterns PTA and PTB are not limited thereto, and various suitable patterns may be applied to detect the coordinate (e.g., position coordinates) of the pen PN and the pen pressure through interaction with the pen PN.

The conductive patterns PTA and PTB may generate a magnetic field by an input current supplied through a transmission line DTL1 of the connection set CS, and the generated magnetic field may be absorbed by the pen PN. Furthermore, the pen PN may release an absorbed magnetic field again, and the magnetic field released by the pen PN may be absorbed by the conductive patterns PTA and PTB. For example, the pen PN may create a magnetic field in response to the magnetic field generated by the conductive patterns PTA and PTB, and the conductive patterns PTA and PTB may absorb the magnetic field created by the pen PN. The input current may be supplied to the conductive patterns PTA and PTB through a current driver (CD) coupled to the transmission line DTL1.

The pen PN may include a resonant circuit PNC having a capacitor and an inductor, and may transmit the magnetic field to the conductive patterns PTA and PTB by the resonant circuit PNC.

Thus, if the pen PN approaches the digitizer 30, the magnetic field of the conductive patterns PTA and PTB is changed by the interaction between the magnetic field outputted from the conductive patterns PTA and PTB and the magnetic field outputted from the resonant circuit PNC of the pen PN, and the change in magnetic field of the conductive patterns PTA and PTB is outputted through a reception line DRL1 of the connection set CS. For example, in some embodiments, the change in magnetic fields near the conductive patterns PTA and PTB generates current, or changes the current, outputted through the reception line DRL1. The coordinate (e.g., position coordinate) of the pen PN and the pen pressure may be detected through the conductive patterns PTA and PTB in which the change in magnetic field and/or electric field is sensed. In this case, the change in magnetic field of the conductive patterns PTA and PTB may be amplified through an amplifier AMP of the connection set CS to be outputted to the reception line DRL1. For example, in some embodiments, the generated current, or the change in current, caused by the change in the magnetic field may be amplified through the amplifier AMP.

According to the embodiment of the present disclosure, the pen PN may include the resonant circuit PNC and may further include a coil PNL that generates an induced current by electromagnetic resonance with the touch sensor 20 of FIG. 3. Furthermore, a pen tip PNT of the pen PN may include (e.g., be made of) a conductive material for the electromagnetic resonance with the touch sensor 20. Therefore, according to the embodiment of the present disclosure, the first digitizer 30-1 and the second digitizer 30-2 may interact with the resonant circuit PNC of the pen PN to sense the position coordinate of the pen PN and the pen pressure, and the touch sensor 20 may interact with the coil PNL for the electromagnetic resonance of the pen PN to sense the position coordinate of the pen PN.

In order to change a contact area with the touch sensor 20 of FIG. 3 depending on the pen pressure of the pen PN, the pen tip PNT of the pen PN may include (e.g., be made of) a soft material or a deformable material depending on contact strength. Therefore, the touch sensor 20 of FIG. 4 may sense the pen pressure of the pen PN by sensing a change in mutual capacitance depending on a change in area where the pen tip PNT of the pen PN comes into contact with the touch sensor 20.

In FIG. 5, only the transmission line DTL1 and the reception line DRL1 of the connection set CS are coupled to the first conductive pattern PTA of the first digitizer 30-1. However, the transmission line and the reception line of the connection set CS may also be coupled to the second conductive pattern PTB. The transmission line DTL1 of the connection set CS may be defined as a term that collectively refers to transmission lines coupled to the first conductive pattern PTA and the second conductive pattern PTB. The reception line DRL1 of the connection set CS may be defined as a term that collectively refers to reception lines coupled to the first conductive pattern PTA and the second conductive pattern PTB.

Because the second digitizer 30-2 may have the same shape as the first digitizer 30-1, the above description (e.g., the above description of the first digitizer 30-1) should be interpreted to be applicable thereto (e.g., to the second digitizer 30-2). Here, the conductive patterns of the second digitizer 30-2 may be symmetrical (e.g., reflectively symmetrical) with the conductive patterns of the first digitizer 30-1 with respect to a central line (in more detail, a line passing through the center of the third region FA in FIG. 1 in a direction parallel (e.g., substantially parallel) to the second direction DR2) of the third region FA.

Figure 6:
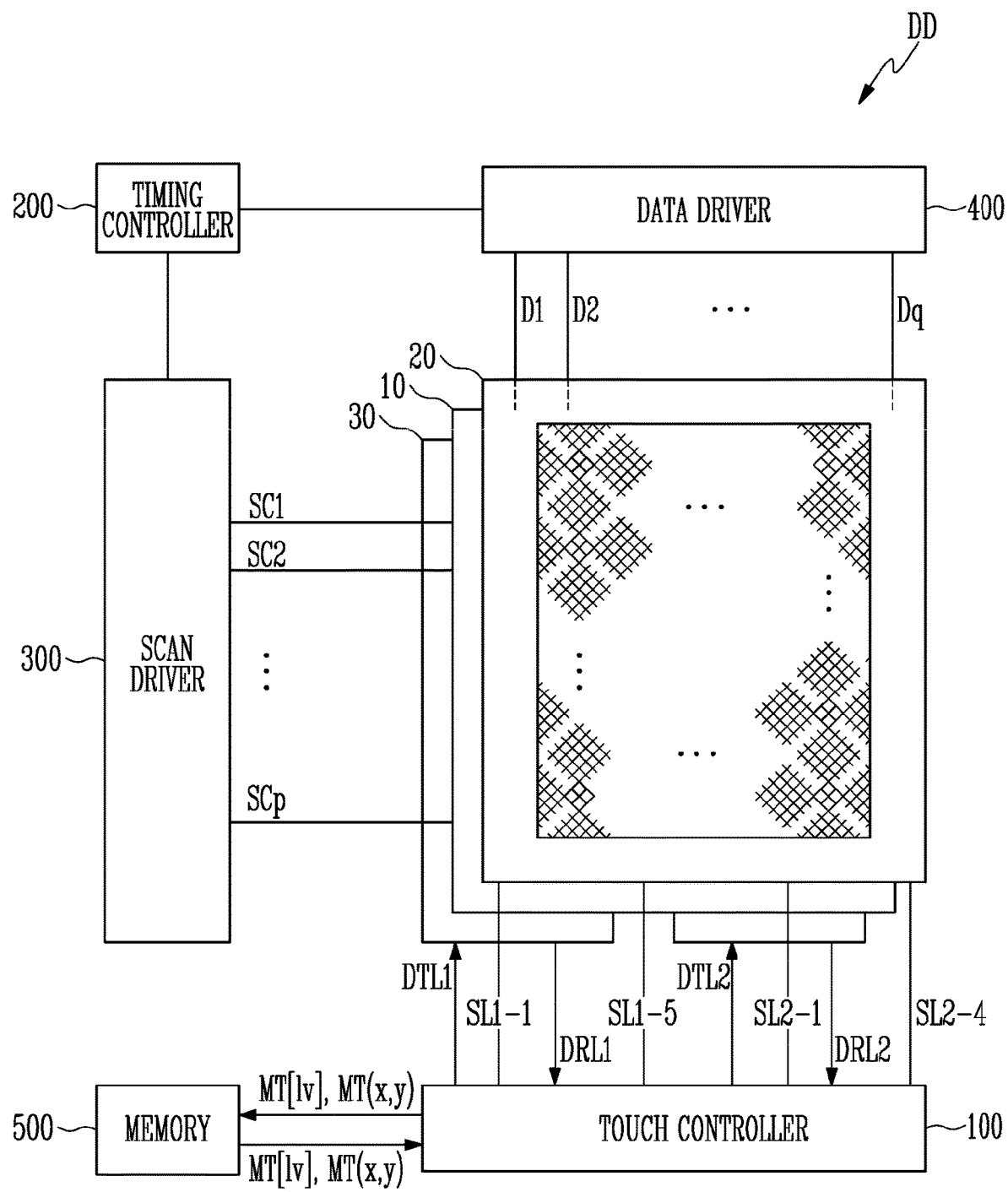
FIG. 6 is a diagram showing the configuration of the foldable display device in accordance with the embodiment of the present disclosure.

FIG. 6 is a diagram showing the configuration of the foldable display device in accordance with the embodiment of the present disclosure.

Referring to FIG. 6, the foldable display device DD according to the embodiment of the present disclosure may include a timing controller 200, a data driver 400, a scan driver 300, a display panel 10, a touch sensor 20, a digitizer 30, a touch controller 100, and a memory 500.

The timing controller 200 may provide grayscale values, a control signal, and the like for each frame of an input image to the data driver 400. Furthermore, the timing controller 200 may provide a clock signal, a control signal, and/or the like to the scan driver 300.

The data driver 400 may generate data voltages to be provided to data lines D1, D2, and Dq (e.g., to data lines D1 to Dq) utilizing the grayscale values and the control signals that are received from the timing controller 200. For example, the data driver 400 may sample the grayscale values utilizing the control signal, and may apply data voltages corresponding to the grayscale values to the data lines D1 to Dq on the basis of a pixel row (e.g. pixels coupled to the same scan line). The number q is an integer greater than 0.

The scan driver 300 may receive the clock signal, the control signal, etc. from the timing controller 200, and may generate scan signals to be provided to the scan lines SC1 to SCp. For example, the scan driver 300 may sequentially provide scan signals having a turn-on level pulse (e.g., a turn-on magnitude pulse) to the scan lines SC1 to SCp. For example, the scan driver 300 may generate scan signals by sequentially transmitting a carry signal having a turn-on level pulse (e.g., a turn-on magnitude pulse) to a next stage in response to the clock signal. The number p may be an integer greater than 0. For instance, the scan driver 300 may be configured in the form of a shift register.

The display panel 10 includes a plurality of pixels. Each pixel may be coupled to a corresponding data line, a corresponding scan line, a corresponding sensing line, and a corresponding reception line. For example, the pixel may refer to a pixel circuit in which a scan transistor is coupled to an i-th scan line and coupled to a j-th data line. Here, the numbers i and j each may be an integer greater than 0.

The touch controller 100 may receive touch data from the touch sensor 20, the first digitizer 30-1, and the second digitizer 30-2, and may correct and output the received touch data. Here, the touch controller 100 may be electrically coupled to first signal lines SL1-1 to SL1-5 and second signal lines SL2-1 to SL2-4 of the touch sensor 20 to receive the touch data from the touch sensor 20. Further, the touch controller 100 may include the connection set CS of the first digitizer 30-1, and the connection set of the second digitizer 30-2. The connection set CS of the first digitizer 30-1 may include the transmission line DTL1 and the reception line DRL1, which are coupled to the conductive patterns of the first digitizer 30-1. The connection set of the second digitizer 30-2 may include the transmission line DTL2 and the reception line DRL2, which are coupled to the conductive patterns of the second digitizer 30-2. Therefore, the touch controller 100 may receive the touch data of the first digitizer 30-1 and the second digitizer 30-2 through the connection set CS of the first digitizer 30-1 and the connection set of the second digitizer 30-2.

As shown in FIG. 3, the first digitizer 30-1 may overlap the first region NFA1 of the display device DD, the second digitizer 30-2 may overlap the second region NFA2 of the display device DD, and the touch sensor 20 may overlap the third region FA of the display device DD.

The memory 500 may receive and store a first matching table MT[lv] and a second matching table MT(x, y) from the touch controller 100 in advance, may receive and store the first matching table MT[lv] and the second matching table MT(x, y) from an external administrator or user, and may provide the first matching table MT[lv] and the second matching table MT(x, y) to the touch controller 100. For example, in some embodiments, the memory 500 may receive and store the first matching table MT[lv] and the second matching table MT(x, y) from either the touch controller 100 or from an external source, such as an administrator or user.

Figure 7:
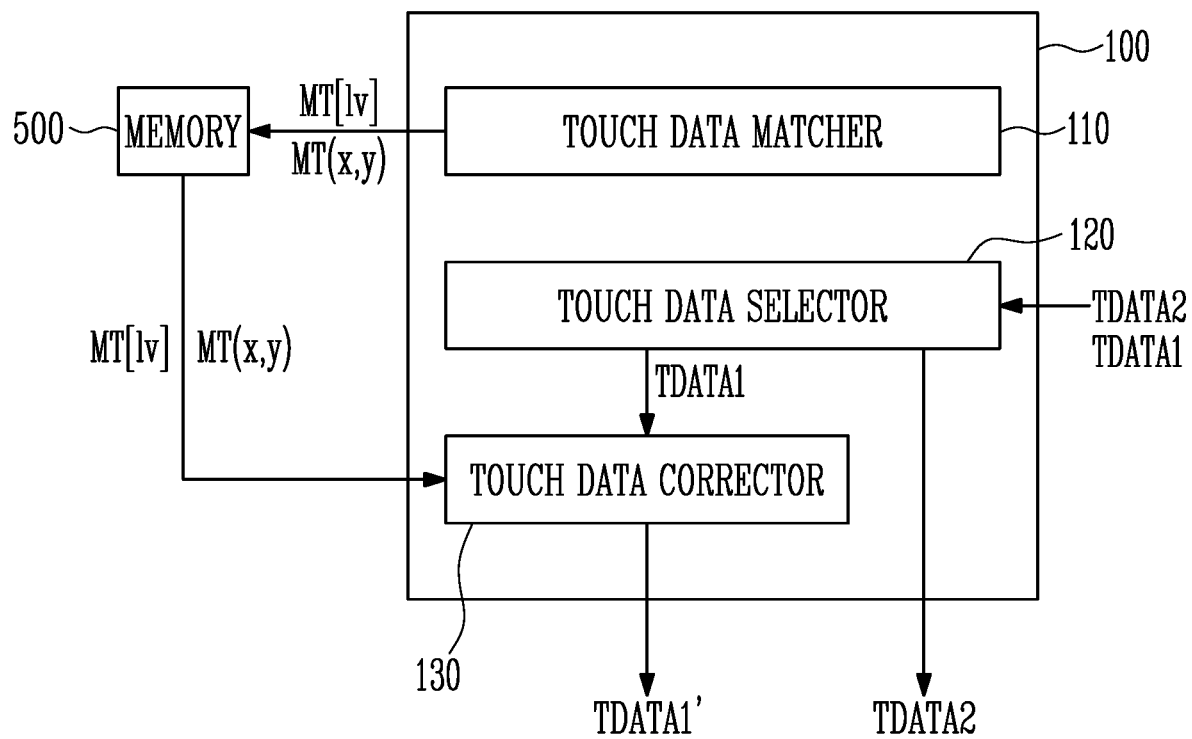
FIG. 7 is a block diagram of a touch controller and a memory shown in FIG. 6.
Figure 8:
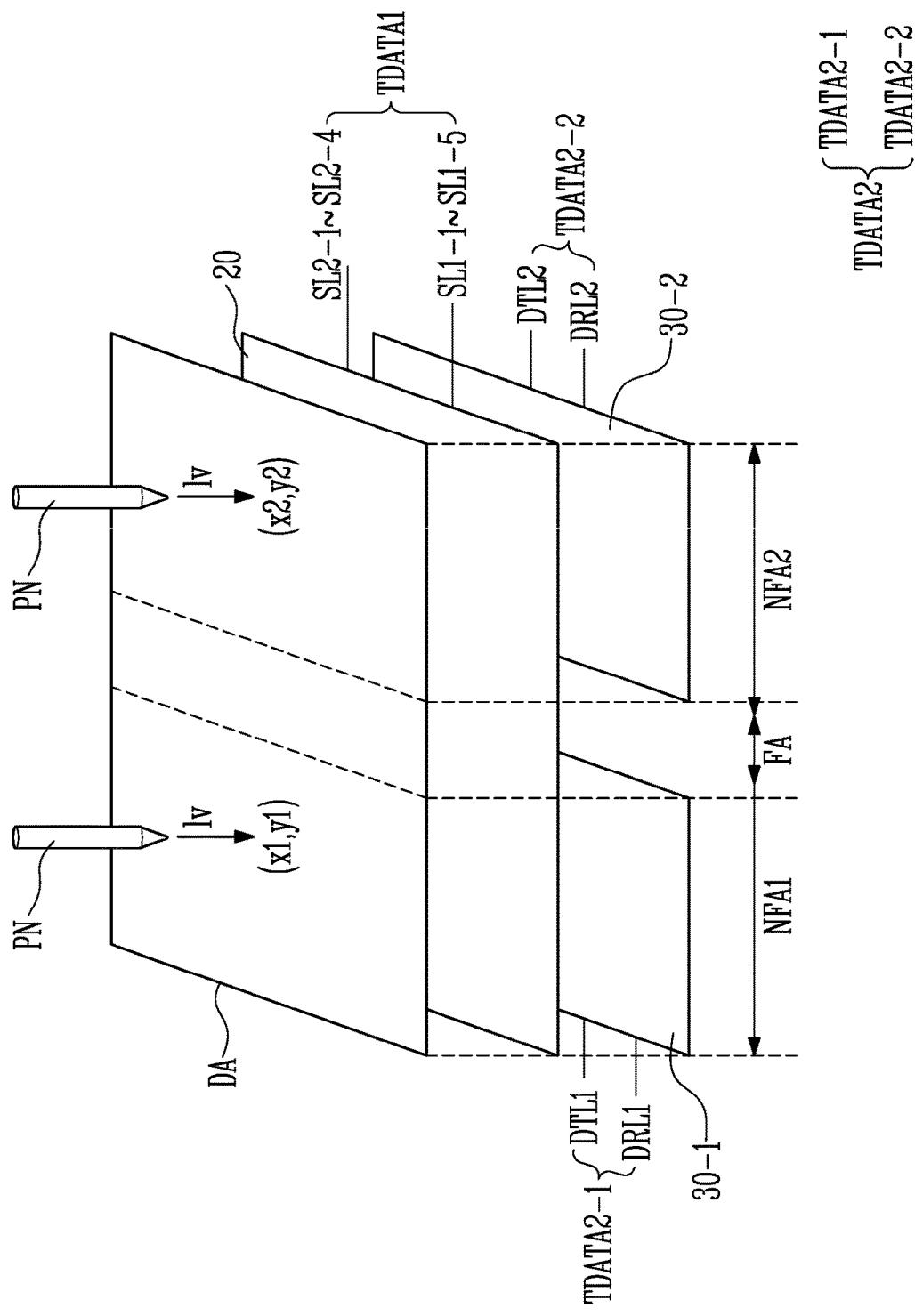
FIG. 8 is a first example view showing touch data received by the touch controller of FIG. 6.
Figure 9:
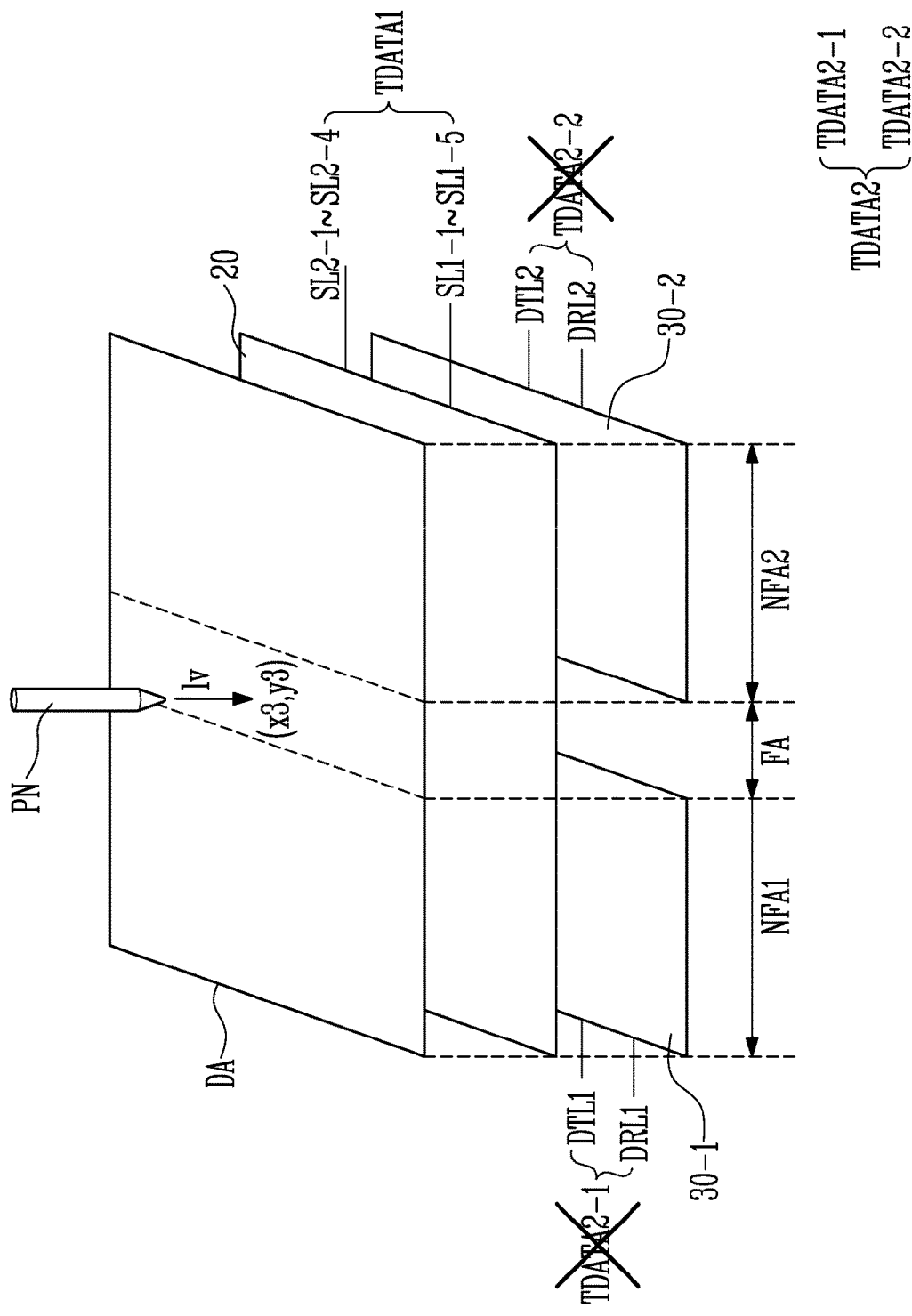
FIG. 9 is a second example view showing the touch data received by the touch controller of FIG. 6.

FIG. 7 is a block diagram of the touch controller and the memory shown in FIG. 6. FIG. 8 is a first example view showing touch data received by the touch controller of FIG. 6. FIG. 9 is a second example view showing the touch data received by the touch controller of FIG. 6.

Referring to FIG. 7, the touch controller 100 may include a touch data matcher 110, a touch data selector 120, and/or a touch data corrector 130.

The touch data matcher 110 may match first touch data TDATA1 received from the touch sensor 20 with second touch data TDATA2 received from the first digitizer 30-1 and/or the second digitizer 30-2 to generate the first matching table MT[lv] and the second matching table MT(x, y) in advance (or before the product is shipped or sold). The first matching table MT[lv] may be data obtained by matching the pen pressure of the first touch data TDATA1 and the pen pressure of the second touch data TDATA2 with each other (see FIG. 8 that will be described later). The second matching table MT(x, y) may be data obtained by matching the position coordinate of the first touch data TDATA1 and the position coordinate of the second touch data TDATA2 with each other (see FIG. 8 that will be described later).

The touch data matcher 110 may store the first matching table MT[lv] and the second matching table MT(x, y) in the memory 500. In some embodiments, the first matching table MT[lv] and the second matching table MT(x, y) may be previously generated from the external user or administrator and inputted into the memory 500.

Referring to FIG. 8, the touch controller 100 may receive both the first touch data TDATA1 and the second touch data TDATA2. For example, as shown in FIG. 8, when the user touches a first point (x1, y1) included in the first region NFA1 of the display region DA utilizing the pen PN, the touch controller 100 may receive the first touch data TDATA1 from the touch sensor 20, and may receive the second touch data TDATA2-1 from the first digitizer 30-1. Furthermore, when the user touches a second point (x2, y2) included in the second region NFA2 of the display region DA utilizing the pen PN, the touch controller 100 may receive the first touch data TDATA1 from the touch sensor 20, and may receive the second touch data TDATA2-2 from the second digitizer 30-2.

The touch data selector 120 may select either the first touch data TDATA1 or the second touch data TDATA2, when both the first touch data TDATA1 and the second touch data TDATA2 are received. For example, if the first touch data TDATA1 is selected, the touch data selector 120 may transmit the first touch data TDATA1 to the touch data corrector 130. If the second touch data TDATA2 is selected, the touch data selector 120 may output the second touch data TDATA2 to an output terminal. For example, according to the embodiment of the present disclosure, when the second touch data TDATA2 received from the first digitizer 30-1 or the second digitizer 30-2 is regarded as reference data, and the first touch data TDATA1 and the second touch data TDATA2 are concurrently or simultaneously received, the touch controller 100 selects (e.g., preferentially selects) and outputs the second touch data TDATA2.

Referring to FIG. 9, the touch controller 100 may receive the first touch data TDATA1, and may not receive the second touch data TDATA2. For example, as shown in FIG. 9, when the user touches a third point (x3, y3) included in the third region FA3 of the display region DA utilizing the pen PN, the touch controller 100 may receive the first touch data TDATA1 from the touch sensor 20, but may not receive the second touch data TDATA2-1 and TDATA2-2 from the first digitizer 30-1 and the second digitizer 30-2.

The touch data selector 120 may transmit the received first touch data TDATA1 to the touch data corrector 130, when the first touch data TDATA1 is received and the second touch data TDATA2 is not received. For example, according to the embodiment of the present disclosure, if only the first touch data TDATA1 is received, the touch controller 100 may correct the received first touch data TDATA1 and then may output the corrected first touch data TDATA1' to the output terminal.

The touch data selector 120 may output the received second touch data TDATA2 to the output terminal, when the first touch data TDATA1 is not received and the second touch data TDATA2 is received. Because it is to be understood that there is an error in the touch sensor 20 when the first touch data TDATA1 is not received and the second touch data TDATA2 is received, an error message about the touch sensor 20 may be output to the output terminal (or second output terminal) along with the second touch data TDATA2.

If the first touch data TDATA1 is received from the touch data selector 120, the touch data corrector 130 may correct the first touch data TDATA1 and output the corrected first touch data TDATA1' to the output terminal with reference to the first matching table MT[lv] and the second matching table MT(x, y) stored in the memory 500.

The second touch data TDATA2 outputted by the touch controller 100 or the corrected first touch data TDATA1' may be displayed on the display panel 10 by the timing controller 200 in a shape according to a corresponding position coordinate and corresponding pen pressure.

Figure 10:
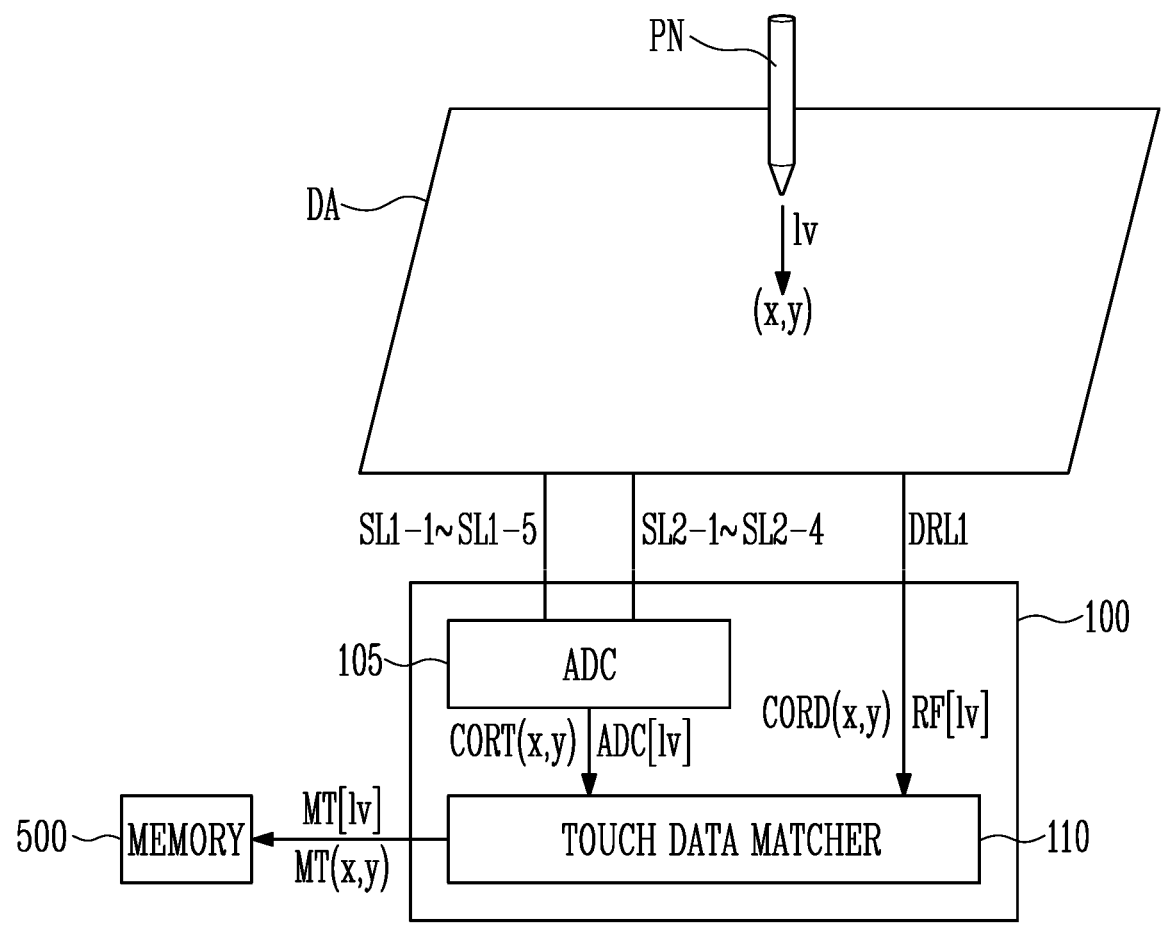
FIG. 10 is an example view illustrating first touch data and second touch data, in accordance with the embodiment of the present disclosure.

FIG. 10 is an example view illustrating the first touch data and the second touch data, according to the embodiment of the present disclosure.

First, a case where a user touches a point (x, y) belonging to the first region NFA1 or the second region NFA2 of the display region DA of the display device DD with the pressure of a certain level lv utilizing the pen PN will be described.

The touch controller 100 may acquire the second touch data TDATA2 through the reception line DRL1 included in the connection set of the first digitizer 30-1 or the second digitizer 30-2. Here, the second touch data TDATA2 may acquire (e.g., include) the position coordinate CORD(x, y) of the pen PN and the pen pressure RF[lv]. If the level lv of the pen pressure of the pen PN changes, a resonant frequency between the resonant circuit PNC in the pen PN and the conductive patterns PTA and PTB of the first digitizer 30-1 or the second digitizer 30-2 is changed. Therefore, the pen pressure RF[lv] included in the second touch data TDATA2 is expressed as a resonant frequency value RF[lv] for each level lv.

Furthermore, the touch controller 100 may acquire the first touch data TDATA1 through the first signal lines SL1-1 to SL1-5 and the second signal lines SL2-1 to SL2-4, which are coupled to the touch sensor 20. The first touch data TDATA1 may acquire (e.g., include) the position coordinate CORT(x, y) of the pen PN and the pen pressure ADC[lv]. If the pen pressure level lv of the pen PN is changed, the contact area of the pen tip PNT with the touch sensor 20 is changed depending on contact strength, because the pen tip PNT of the pen PN is made of a soft material or a deformable material. Because the pen tip PNT of the pen PN includes (e.g., is made of) a conductive material, a mutual capacitance value between the first sensing electrodes 1E1-1 to 1E1-5 (see FIG. 4) coupled to the first signal lines and the second sensing electrodes 1E2-1 to 1E2-4 (see FIG. 4) coupled to the second signal lines is changed. Thus, if the change in mutual capacitance value caused by the pen pressure is converted into a digital signal through an analog-digital converter (ADC) 105, the pen pressure ADC[lv] for each level lv included in the first touch data TDATA1 may be acquired.

As such, the pen pressure ADC[lv] of the first touch data TDATA1 and the pen pressure RF[lv] of the second touch data TDATA2 may have different forms and values. Furthermore, the position coordinate CORT(x, y) of the first touch data TDATA1 and the position coordinate CORD(x, y) of the second touch data TDATA2 may be different from each other due to different sensing methods and arrangements (see FIG. 3).

Therefore, the touch data matcher 110 may generate the first matching table MT[lv], by matching the pen pressure ADC[lv] of the pen PN received from the touch sensor 20 with the pen pressure RF[lv] of the pen PN received from the first digitizer 30-1 or the second digitizer 30-2. Furthermore, the touch data matcher 110 may generate the second matching table MT(x, y), by matching the position coordinate CORT(x, y) of the pen PN received from the touch sensor 20 with the position coordinate CORD(x, y) of the pen PN received from the first digitizer 30-1 or the second digitizer 30-2.

Figure 11:
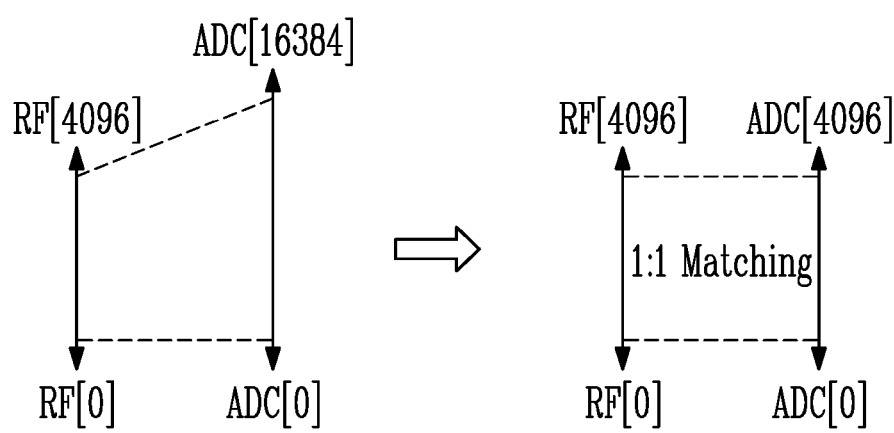
FIG. 11 is a diagram illustrating a first matching table in accordance with the embodiment of the present disclosure.

FIG. 11 is a diagram illustrating the first matching table in accordance with the embodiment of the present disclosure.

The pen pressure level lv of the first touch data TDATA1 has a set or preset pen pressure level. The pen pressure level lv of the first touch data TDATA1 may vary depending on the pen pressure level supported by the touch sensor 20 and the pen PN. For example, when the pen pressure level according to a change in mutual capacitance between the touch sensor 20 and the pen PN is one of 0 to 16384, the pen pressure level lv included in the first touch data TDATA1 may support from 0 (ADC[0]) up to 16384 (ADC[16384]).

The pen pressure level lv of the second touch data TDATA2 has a set or preset pen pressure level. The pen pressure level lv of the second touch data TDATA2 may vary depending on the pen pressure level supported by the first digitizer 30-1 or the second digitizer 30-2, and the pen PN. For example, when the pen pressure level due to the change in resonant frequency between the first digitizer 30-1 or the second digitizer 30-2 and the pen PN is one of 0 to 4096, the pen pressure level lv of the second touch data TDATA2 may support from 0 (RF[0]) up to 4096 (RF[4096]).

When the pen pressure level lv of the first touch data TDATA1 is equal to the pen pressure level lv of the second touch data TDATA2, the touch data matcher 110 may match the pen pressure level lv of the first touch data TDATA1 with the pen pressure level lv of the second touch data TDATA2 in one-to-one correspondence, thus generating the first matching table MT[lv]. Therefore, the first matching table MT[lv] stored in the memory 500 may include data obtained by matching the pen pressure level lv of the first touch data TDATA1 with the pen pressure level lv of the second touch data TDATA2 in one-to-one correspondence.

When the pen pressure level lv of the first touch data TDATA1 is different from the pen pressure level lv of the second touch data TDATA2, the touch data matcher 110 may interpolate the pen pressure level of the touch data having a larger pen pressure level, thus generating the first matching table MT[lv]. Thus, when the pen pressure level lv of the first touch data TDATA1 is different from the pen pressure level lv of the second touch data TDATA2, the first matching table MT[lv] stored in the memory 500 may be previously generated by interpolating the pen pressure level of the touch data having a larger pen pressure level.

For example, when the first touch data TDATA1 and the second touch data TDATA2 have a difference in pen pressure level as shown in a left diagram of FIG. 11, four pen pressure levels of the first touch data TDATA1 are matched with one pen pressure level of the second touch data TDATA2, so that the pen pressure level of the first touch data TDATA1 and the pen pressure level of the second touch data TDATA2 may be matched 1:1 as shown in a right diagram of FIG. 11. For example, in some embodiments, the four pen pressure levels ADC[16381], ADC[16382], ADC[16383], and ADC[16384] of the first touch data TDATA1 may be matched with the one pen pressure level RF[4096] of the second touch data TDATA2.

Here, the touch data matcher 110 may generate the first matching table MT[lv] by 1:1 matching the first touch data and the second touch data applied with each pen pressure level at one or more identical positions.

Furthermore, the touch data corrector 130 may output the corrected first touch data TDATA1' by correcting (or replacing) the first touch data TDATA1 at the pen pressure level of the second touch data TDATA2 matched with the pen pressure level of the first touch data TDATA1, with reference to the first matching table MT[lv]. For example, in some embodiments, the touch data corrector 130 may correct or replace the pen pressure level of the first touch data TDATA1 by utilizing the first matching table MT[lv]. For example, in some embodiments, the touch data corrector 130 may replace the pen pressure level of the first touch data TDATA1 with the pen pressure level of the second touch data TDATA2 matched to the pen pressure level of the first touch data TDATA1 according to the first matching table MT[lv].

Figure 12:
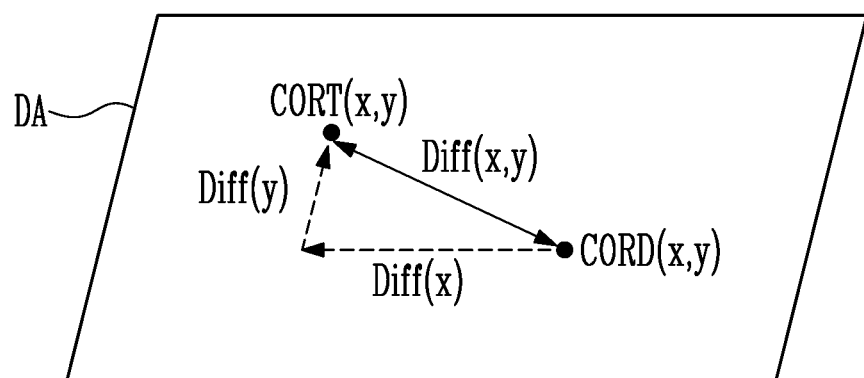
FIG. 12 is a diagram illustrating a second matching table in accordance with the embodiment of the present disclosure.

FIG. 12 is a diagram illustrating the second matching table in accordance with the embodiment of the present disclosure.

When the pen PN is touched at the same position, the position coordinate of the first touch data TDATA1 and the position coordinate of the second touch data TDATA2 should be equal to each other. However, even if the same position is recognized because the first touch data TDATA1 and the second touch data TDATA2 utilize different arrangements and touch recognition methods, the position coordinate of the first touch data TDATA1 may be different from the position coordinate of the second touch data TDATA2. In order to solve the problem, the second matching table MT(x, y) obtained by matching the position coordinate of the first touch data TDATA1 with the position coordinate of the second touch data TDATA2 may be stored in the memory 500 according to the embodiment of the present disclosure.

For example, referring to FIG. 12, when the pen PN is touched at the same position, a difference Diff(x, y) may occur between the position coordinate CORT(x, y) of the first touch data TDATA1 and the position coordinate CORD(x, y) of the second touch data TDATA2. Here, the difference Diff(x, y) includes an x-axis difference Diff(x) and a y-axis difference Diff(y) between the position coordinate CORT(x, y) of the first touch data TDATA1 and the position coordinate CORD(x, y) of the second touch data TDATA2. In more detail, the difference Diff(x, y) may be a value obtained by subtracting the position coordinate CORT(x, y) of the first touch data TDATA1 from the position coordinate CORD(x, y) of the second touch data TDATA2.

The touch data matcher 110 may calculate differences between the position coordinate CORT(x, y) of the first touch data TDATA1 and the position coordinate CORD(x, y) of the second touch data TDATA2 which are measured at a plurality of touch positions (e.g., a plurality of touch positions belonging to the third region FA), and may generate the second matching table MT(x, y) as an average value of the calculated differences. Therefore, the second matching table MT(x, y) stored in the memory 500 may include the differences between the position coordinate CORT(x, y) of the first touch data TDATA1 and the position coordinate CORD(x, y) of the second touch data TDATA2, which are measured at the plurality of touch positions (e.g., the plurality of touch positions belonging to the third region FA), or the average value of the differences.

The touch data corrector 130 may output the corrected first touch data TDATA1', by adding the average value of the differences included in the second matching table MT(x, y) to the position coordinate of the first touch data TDATA1. In some embodiments, the touch data corrector 130 may correct or replace the position coordinate of the first touch data TDATA1 by utilizing the second matching table MT(x, y). For example, in some embodiments, the touch data corrector 130 may correct the position coordinate of the first touch data TDATA1 by adding to the position coordinate of the first touch data TDATA1 either the average of the differences included in the second matching table MT(x, y) or the particular difference from the second matching table MT(x, y) that is associated with the position coordinate of the first touch data TDATA1.

FIG. 13 is a diagram illustrating the operation of the touch data selector shown in FIG. 7.

Referring to FIG. 13, when a user touches the display region DA utilizing the pen PN, the position coordinate included in the first touch data and/or the second touch data may range from (0, 0) to (n, m), where the number n and m are any integers. As the touch position progresses in the first direction DR1, the y coordinate of the position coordinate may increase from 0 to m. Furthermore, as the touch position progresses in the second direction DR2', the x coordinate of the position coordinate may increase from 0 to n.

In this case, the third region FA of the display region DA may have position coordinates whose y coordinate is between c1 and c2. Due to the arrangement of the first digitizer 30-1 and the second digitizer 30-2 of FIG. 3, the position coordinate belonging to the third region FA of the display region DA is not recognized by the first digitizer 30-1 and the second digitizer 30-2.

Therefore, the touch data selector 120 may determine whether the position coordinate of the first touch data TDATA1 belongs to the third region FA of the display region DA.

According to the embodiment of the present disclosure, when the position coordinate of the first touch data TDATA1 does not belong to the third region FA of the display region DA, the second touch data TDATA2 may be utilized, and the first touch data TDATA1 may not be utilized. Therefore, when the position coordinate of the first touch data TDATA1 does not belong to the third region FA of the display region DA, the touch data selector 120 may select and output the second touch data TDATA2 from among the first touch data TDATA1 and the second touch data TDATA2.

According to the embodiment of the present disclosure, when the position coordinate of the first touch data TDATA1 belongs to the third region FA of the display region DA, the first touch data TDATA1 may be utilized, and the second touch data TDATA2 may not be utilized (or the second touch data TDATA2 may not be received due to the layout structure of the digitizers 30-1 and 30-2). Therefore, when the position coordinate of the first touch data TDATA1 belongs to the third region FA of the display region DA, the touch data selector 120 may select the first touch data TDATA1 from among the first touch data TDATA1 and the second touch data TDATA2, and may transmit the first touch data TDATA1 to the touch data corrector 130.

Figure 14:
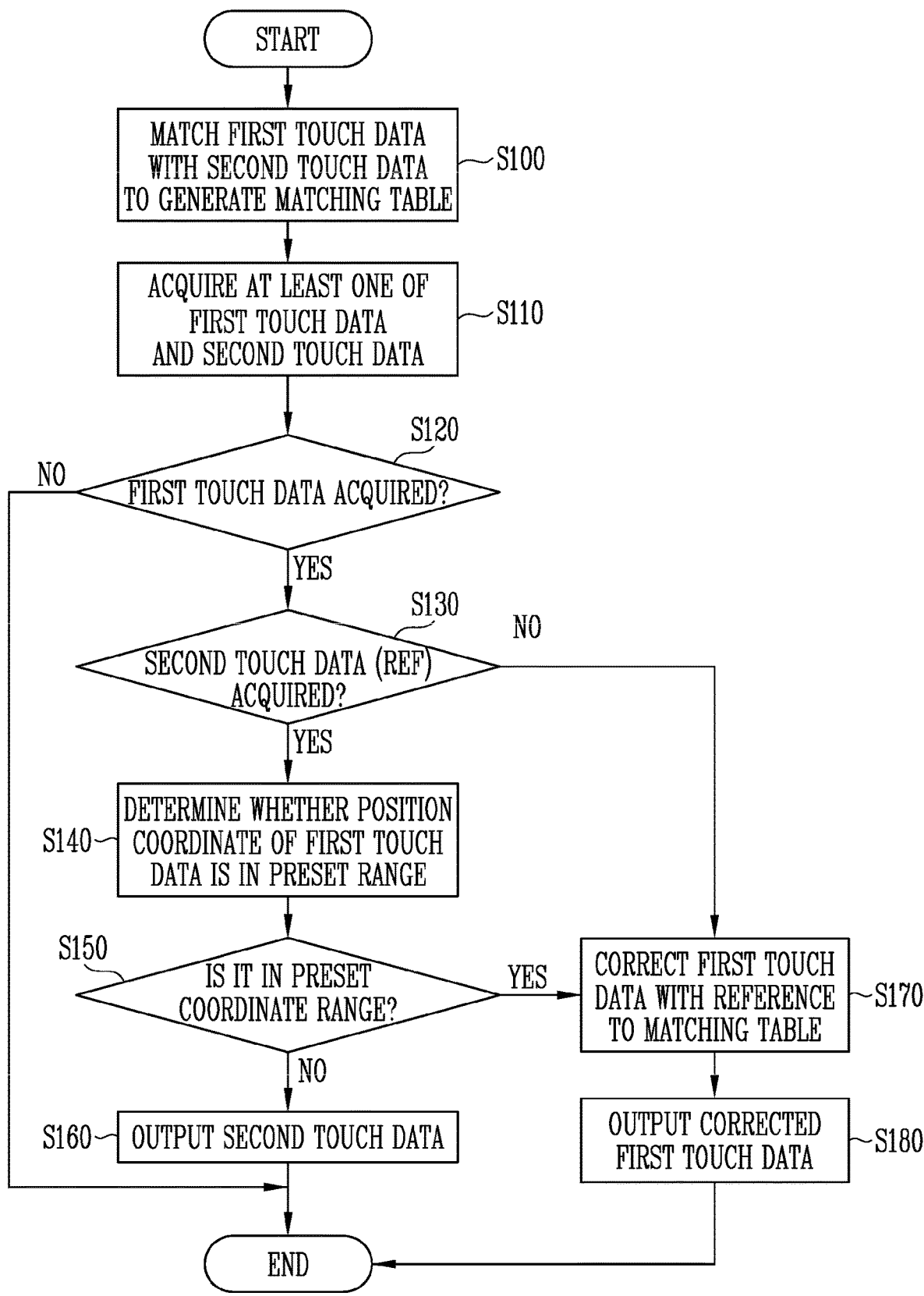
FIG. 14 is a flowchart showing a method of driving a foldable display device in accordance with an embodiment of the present disclosure.

FIG. 14 is a flowchart showing a method of driving a foldable display device in accordance with an embodiment of the present disclosure.

The method of driving the foldable display device in accordance with the embodiment of the present disclosure may be performed by the foldable display device of FIGS. 1 to 13. For example, the foldable display device DD may include a first region NFA1, a second region NFA2, and a third region FA that may bend along a folding axis between the first region NFA1 and the second region NFA2.

Referring to FIG. 14, the driving method of the foldable display device DD may first include a task S100 of generating a matching table by matching first touch data TDATA1 with second touch data TDATA2.

The first touch data TDATA1 may be data collected from the touch sensor 20 that is disposed or directly disposed on the upper surface of the display panel 10 of the foldable display device DD.

The second touch data TDATA2 may be data collected from the first digitizer 30-1 overlapping the first region NFA1 under the display panel 10, and the second digitizer 30-2 overlapping the second region NFA2 under the display panel 10.

The task of generating the matching table may include a task of generating the first matching table MT[lv] by matching the pen pressure of the first touch data TDATA1 with the pen pressure of the second touch data TDATA2.

The task of generating the matching table may include a task of generating the second matching table MT(x, y) by matching the position coordinate of the first touch data TDATA1 with the position coordinate of the second touch data TDATA2.

The second matching table may include a position coordinate difference between the position coordinate of the first touch data TDATA1 and the position coordinate of the second touch data TDATA2.

The task S100 of generating the matching table may be previously performed before the product of the foldable display device DD is shipped or may be performed during an initialization stage, and the task S100 may include a task of storing the matching table(s), generated from an outside, in the memory 500 of the foldable display device DD.

The driving method may further include a task S110 of acquiring at least one selected from among the first touch data and the second touch data, after the task S100 of generating the matching table.

For example, when a user touches a position coordinate within the first region NFA1 or the second region NFA2, as shown in FIG. 8, both the first touch data and the second touch data may be acquired. Further, when the user touches a position coordinate within the third region, as shown in FIG. 9, the first touch data may be acquired and the second touch data may not be acquired.

When the first touch data is acquired at task S120 and the second touch data is acquired at task S130, one of corrected first touch data and the second touch data may be outputted according to a set or preset reference.

For example, it is determined whether the position coordinate of the first touch data TDATA1 belongs to a set or preset range at task S140. If it is determined that the position coordinate of the first touch data does not belong to the set or preset range at task S150, the second touch data may be outputted at task S160. Here, the set or preset range may be position coordinates included within the third region FA.

Furthermore, if it is determined that the position coordinate of the first touch data belongs to the set or preset range at task S150, the first touch data may be corrected with reference to the matching table at task S170, and the corrected first touch data may be outputted at task S180.

The task S170 of correcting the first touch data may include a task of correcting the pen pressure level of the first touch data TDATA1 at the pen pressure level of the second touch data TDATA2 matched with the pen pressure level of the first touch data TDATA1 with reference to the matching table.

The task S170 of correcting the first touch data may include a task of correcting the position coordinate of the first touch data TDATA1 by a position coordinate difference between the first touch data TDATA1 and the second touch data TDATA2 with reference to the matching table.

If the first touch data TDATA1 is acquired at task S120 and the second touch data TDATA2 is not acquired at task S130, the task S170 of correcting the first touch data TDATA1 may be performed.

Furthermore, unless the first touch data is acquired at task S120, an error message may be outputted or the second touch data may be acquired at task S130, so that tasks S140 and S150 may be omitted and the second touch data may be immediately outputted at task S160. For example, in some embodiments, if the first touch data is not acquired at task S120, an error message may be outputted, and furthermore, the second touch data may be immediately outputted at task S160 by skipping tasks S130, S140, and S150, or tasks S130, S140, and S150 may be performed to determine at task S130 that the second touch data has been acquired and to determine at tasks S140 and S150 that the position coordinate of the non-acquired first touch data is not in the set or preset range so that the second touch data is output at task S160.

A foldable display device and a driving method thereof according to the present disclosure can ensure stable touch recognition performance in a foldable region.

Furthermore, a product life of a display device can be improved by reducing or minimizing a reduction in durability due to a folding operation, and uniform touch recognition performance can be guaranteed in both a foldable region and a planar region.

The display device and/or any other relevant devices or components according to embodiments of the present invention described herein may be implemented utilizing any suitable hardware, firmware (e.g., an application-specific integrated circuit), software, or a combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on one substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The detailed description of the disclosure described with reference to the drawings is merely illustrative, which is used only for the purpose of describing the disclosure and is not used to limit the meaning or scope of the disclosure as defined in the accompanying claims and equivalents thereof. Therefore, those skilled in the art will understand that various suitable modifications and equivalences thereof are possible. Accordingly, the bounds and scope of the present disclosure should be determined by the technical spirit of the following claims and equivalents thereof.

What is claimed is:

1. A foldable display device, comprising:
a first layer;
a second layer on a lower surface of the first layer;
a display panel comprising a first region, a second region, a third region configured to bend along a folding axis between the first region and the second region, and pixels in the first region, the second region, and the third region;
a touch sensor overlapping the third region in a plan view, and located between an upper surface of the display panel and a lower surface of the second layer;
a first digitizer under the display panel to overlap the first region in the plan view; and a second digitizer under the display panel to overlap the second region in the plan view, wherein the first region and the second region comprise a non-folding region, and wherein the third region comprises a folding region. panel.

2. The foldable display device according to claim 1, wherein the first layer comprises a cover window glass to protect the display panel.

3. The foldable display device according to claim 2, wherein the first layer comprises at least one of an ultra-thin glass (UTG) and a colorless polyimide (CPI).

4. The foldable display device according to claim 2, wherein the second layer comprises a polarizer coupled to the lower surface of the first layer via a first adhesive layer.

5. The foldable display device according to claim 4, wherein the second layer comprises at least one of a polyethylene terephthalate (PET) film and a tri-acetyl cellulose (TAC) film.

6. The foldable display device according to claim 4, wherein the first adhesive layer comprises a transparent adhesive material to fill an air gap between the first layer and the second layer.

7. The foldable display device according to claim 1, wherein the touch sensor is coupled to the lower surface of the second layer via a second adhesive layer.

8. The foldable display device according to claim 7, wherein the second adhesive layer comprises a conductive adhesive member having adhesive strength and electrical conductivity.

9. The foldable display device according to claim 8, wherein the second adhesive layer comprises a conductive pressure sensitive adhesive (PSA).

10. The foldable display device according to claim 1, wherein the touch sensor overlaps the first region and the second region.

11. The foldable display device according to claim 1, wherein the second digitizer is not overlapping the first digitizer in the plan view.

12. The foldable display device according to claim 1, wherein the touch sensor does not overlap the first region and the second region.

13. A foldable display device, comprising:
a first layer;
a second layer on a lower surface of the first layer;
a display panel comprising a first region, a second region, a third region configured to bend along a folding axis between the first region and the second region, and pixels in the first region, the second region, and the third region;
a touch sensor overlapping the third region in a plan view, and located between an upper surface of the display panel and a lower surface of the second layer;
a first digitizer under the display panel to overlap the first region in the plan view; and
a second digitizer under the display panel to overlap the second region in the plan view,
wherein the first region and the second region comprise a non-folding region,
wherein the third region comprises a folding region; and
wherein the first digitizer and the second digitizer are spaced from each other to not overlap the third region.

14. A method of driving a foldable display device, the method comprising:
acquiring at least one selected from among first touch data of the foldable display device and second touch data of the foldable display device; and
outputting one of
corrected first touch data, corrected from the first touch data, or
the second touch data,
according to a set reference,
wherein the foldable display device comprises:
a first layer,
a second layer on a lower surface of the first layer, and
a display panel comprising a first region, a second region, a third region configured to bend along a folding axis between the first region and the second region, and pixels in the first region, the second region, and the third region,
wherein the first touch data comprises data collected from a touch sensor overlapping the third region in a plan view and located between an upper surface of the display panel and a lower surface of the second layer,
wherein the second touch data comprises data collected from at least one selected from among a first digitizer under the display panel to overlap the first region in the plan view and a second digitizer under the display panel to overlap the second region in the plan view,
wherein the first region and the second region comprise a non-folding region, and
wherein the third region comprises a folding region.

15. The method according to claim 14, wherein the outputting outputs the second touch data if both the first touch data and the second touch data are received and a position coordinate of the first touch data corresponds to the first region or the second region.

16. The method according to claim 15, wherein the outputting comprises correcting the first touch data, if the position coordinate of the first touch data corresponds to the third region.

17. The method according to claim 14, wherein the first layer comprises a cover window glass to protect the display panel.

18. The method according to claim 14, wherein the second layer comprises a polarizer coupled to the lower surface of the first layer via a first adhesive layer.

19. The method according to claim 14, wherein the touch sensor is coupled to the lower surface of the second layer via a second adhesive layer.

* * * * *

UNITED STATES PATENT AND TRADEMARK OFFICE
CERTIFICATE OF CORRECTION

| | |
|---|---|
| PATENT NO. | : 11,836,003 B2 |
| APPLICATION NO. | : 17/694409 |
| DATED | : December 5, 2023 |
| INVENTOR(S) | : Jong Man Bae et al. |

It is certified that error appears in the above-identified patent and that said Letters Patent is hereby corrected as shown below:

In the Claims

In Column 19, Line 6, in Claim 1, below "region." delete "panel.".

Signed and Sealed this
Sixteenth Day of April, 2024

Katherine Kelly Vidal
*Director of the United States Patent and Trademark Office*